(12) United States Patent
Cain

(10) Patent No.: US 9,647,176 B2
(45) Date of Patent: May 9, 2017

(54) REFLECTIVE DISPLAY DEVICES

(75) Inventor: Paul Cain, Cambridge (GB)

(73) Assignee: FLEXENABLE LIMITED, Cambridge (GB)

( * ) Notice: Subject to any disclaimer, the term of this patent is extended or adjusted under 35 U.S.C. 154(b) by 0 days.

(21) Appl. No.: 14/111,115

(22) PCT Filed: Apr. 5, 2012

(86) PCT No.: PCT/EP2012/056358
§ 371 (c)(1),
(2), (4) Date: Nov. 4, 2013

(87) PCT Pub. No.: WO2012/139981
PCT Pub. Date: Oct. 18, 2012

(65) Prior Publication Data
US 2014/0048835 A1 Feb. 20, 2014

(30) Foreign Application Priority Data
Apr. 11, 2011 (GB) .................... 1106048.0

(51) Int. Cl.
*H01L 33/40* (2010.01)
*H01L 33/36* (2010.01)
(Continued)

(52) U.S. Cl.
CPC .......... *H01L 33/405* (2013.01); *G02F 1/1362* (2013.01); *G02F 1/133504* (2013.01);
(Continued)

(58) Field of Classification Search
CPC ....... H01L 21/70; H01L 27/15; H01L 33/405; H01L 33/36; H01L 51/5218; G02F 1/133553; G02F 1/1343
See application file for complete search history.

(56) References Cited

U.S. PATENT DOCUMENTS

| 5,408,345 A | 4/1995 | Mitsui et al. |
| 6,342,935 B1 | 1/2002 | Jang et al. |

(Continued)

FOREIGN PATENT DOCUMENTS

| JP | 10-282514 A | 10/1998 |
| WO | 03/089980 A1 | 10/2003 |
| WO | 2005/029169 A1 | 3/2005 |

OTHER PUBLICATIONS

International Search Report of PCT/EP2012/056358, dated Jun. 13, 2012.
UK Search Report of GB1106048.0, dated Aug. 1, 2012.

*Primary Examiner* — Thanhha Pham
(74) *Attorney, Agent, or Firm* — Sughrue Mion, PLLC

(57) ABSTRACT

A technique of producing a control component for a reflective display device, comprising: forming an array of electronic switching devices; forming over said array of electronic switching devices an insulator region defining a controlled surface topography; and forming on the patterned surface of the insulator region by a conformal deposition technique a substantially planar array of reflective pixel conductors each independently controllable via a respective one of the array of electronic switching devices, wherein each pixel conductor exhibits specular reflection at a range of reflection angles relative to the plane of the array of pixel conductors for a given incident angle relative to the plane of the array of pixel conductors.

17 Claims, 3 Drawing Sheets

(51) Int. Cl.
*G02F 1/133* (2006.01)
*G02F 1/136* (2006.01)
*G02F 1/1335* (2006.01)
*G02F 1/1362* (2006.01)
*H01L 27/15* (2006.01)

(52) U.S. Cl.
CPC ........ *G02F 1/133553* (2013.01); *H01L 27/15* (2013.01); *H01L 33/36* (2013.01); *H01L 33/40* (2013.01)

(56) References Cited

U.S. PATENT DOCUMENTS

| | | |
|---|---|---|
| 2003/0169513 A1 | 9/2003 | Kaminsky et al. |
| 2007/0139591 A1 | 6/2007 | Kim |
| 2008/0151159 A1 | 6/2008 | Kim et al. |
| 2008/0268378 A1* | 10/2008 | Bae ............... G02B 3/0012 430/321 |
| 2010/0026941 A1* | 2/2010 | Umeno et al. ............. 349/113 |

* cited by examiner

REFLECTIVE DISPLAY DEVICES

CROSS-REFERENCE TO RELATED APPLICATIONS

This application is a National Stage of International Application No. PCT/EP2012/056358 filed Apr. 5, 2012, claiming priority on British Patent Application No. 1106048.0, filed Apr. 11, 2011, the contents of all of which are incorporated herein by reference in their entirety.

Pixellated reflective display devices operate by independently controlling the amount of incident light reflected back through each respective pixel region of a display media from a reflective surface at the rear of the display media.

Some reflective display devices include a diffuser between a flat reflective surface and the display media with the aim of achieving good display performance at a relatively large range of viewing angles even when the incident light exhibits highly direction-dependent intensity.

There has been identified the challenge of achieving the same kind of good display performance in other ways. It is one aim of the present invention to meet such challenge.

There is hereby provided a method of producing a control component for a reflective display device, the method comprising: forming an array of electronic switching devices; forming over said array of electronic switching devices an insulator region defining a controlled surface topography; and forming on the patterned surface of the insulator region by a conformal deposition technique a substantially planar array of reflective pixel conductors each independently controllable via a respective one of the array of electronic switching devices, wherein each pixel conductor exhibits specular reflection at a range of reflection angles relative to the plane of the array of pixel conductors for a given incident angle relative to the plane of the array of pixel conductors.

According to one embodiment, the controlled surface topography comprises an array of convex features and/or an array of concave features.

According to one embodiment, the controlled surface topography is such that no point on said controlled surface topography has a tangent plane exhibiting an angle of more than about 10 degrees relative to the plane of the array of pixel conductors.

According to one embodiment, the controlled surface topography exhibits a controlled degree of irregularity.

According to one embodiment, the controlled surface topography defines a pattern repeated in an ordered manner over the surface of the insulator region.

According to one embodiment, said repeating pattern exhibits a degree of irregularity.

According to one embodiment, the controlled surface topography defines an irregular unit pattern repeated at a pitch substantially no smaller than the dimensions of one of the array of pixel conductors.

According to one embodiment, the controlled surface topography defines an irregular unit pattern repeated at a pitch greater than the wavelength of visible light.

According to one embodiment, forming said insulator region comprises depositing insulating material over the array of electronic switching devices and then patterning the surface of the deposited insulating material by laser ablation to achieve said controlled surface topography.

There is also hereby provided a control component for a reflective display device, the control component comprising: an array of electronic switching devices; an insulator region formed over said array of electronic switching devices and defining a controlled surface topography; and a planar array of reflective pixel conductors formed on the patterned surface of the insulator region and each independently controllable via a respective one of the array of electronic switching devices; wherein each pixel conductor has an upper surface substantially conforming to the surface of the insulator region and exhibits specular reflection at a range of reflection angles relative to the plane of the array of pixel conductors for a given incidence angle relative to the plane of the array of pixel conductors.

According to one embodiment, the controlled surface topography comprises an array of convex features and/or an array of concave features.

According to one embodiment, the controlled surface topography is such that no point on said controlled surface topography has a tangent plane exhibiting an angle of more than about 10 degrees relative to the plane of the array of pixel conductors.

According to one embodiment, the controlled surface topography exhibits a controlled degree of irregularity.

According to one embodiment, the controlled surface topography defines a pattern repeated in an ordered manner over the surface of the insulator region.

According to one embodiment, said repeating pattern exhibits a degree of irregularity.

According to one embodiment, the controlled surface topography defines an irregular unit pattern repeated at a pitch substantially no smaller than the dimensions of one of the array of pixel conductors.

According to one embodiment, the controlled surface topography defines an irregular unit pattern repeated at a pitch greater than the wavelength of visible light.

An embodiment of the present invention is described in detail hereunder, by way of example only, with reference to the accompanying drawings, in which.

An embodiment of the present invention is described hereunder for the example of a pixellated reflective display device controlled by an array of independently controllable top-gate thin-film-transistors (TFTs). However, the same techniques are also of use in other reflective display devices.

Figure 1:
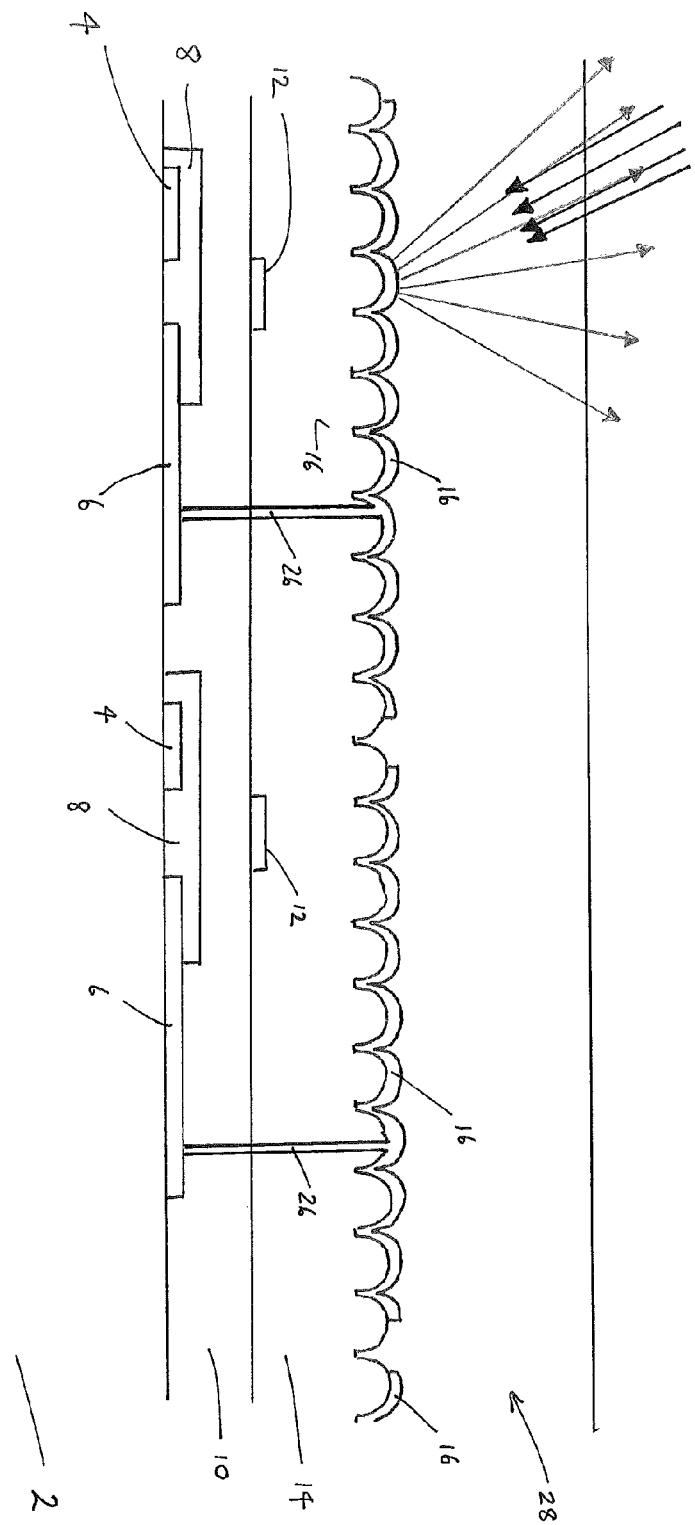
FIG. 1 illustrates a reflective display device incorporating an example of a control component according to an embodiment of the present invention.
Figure 2:
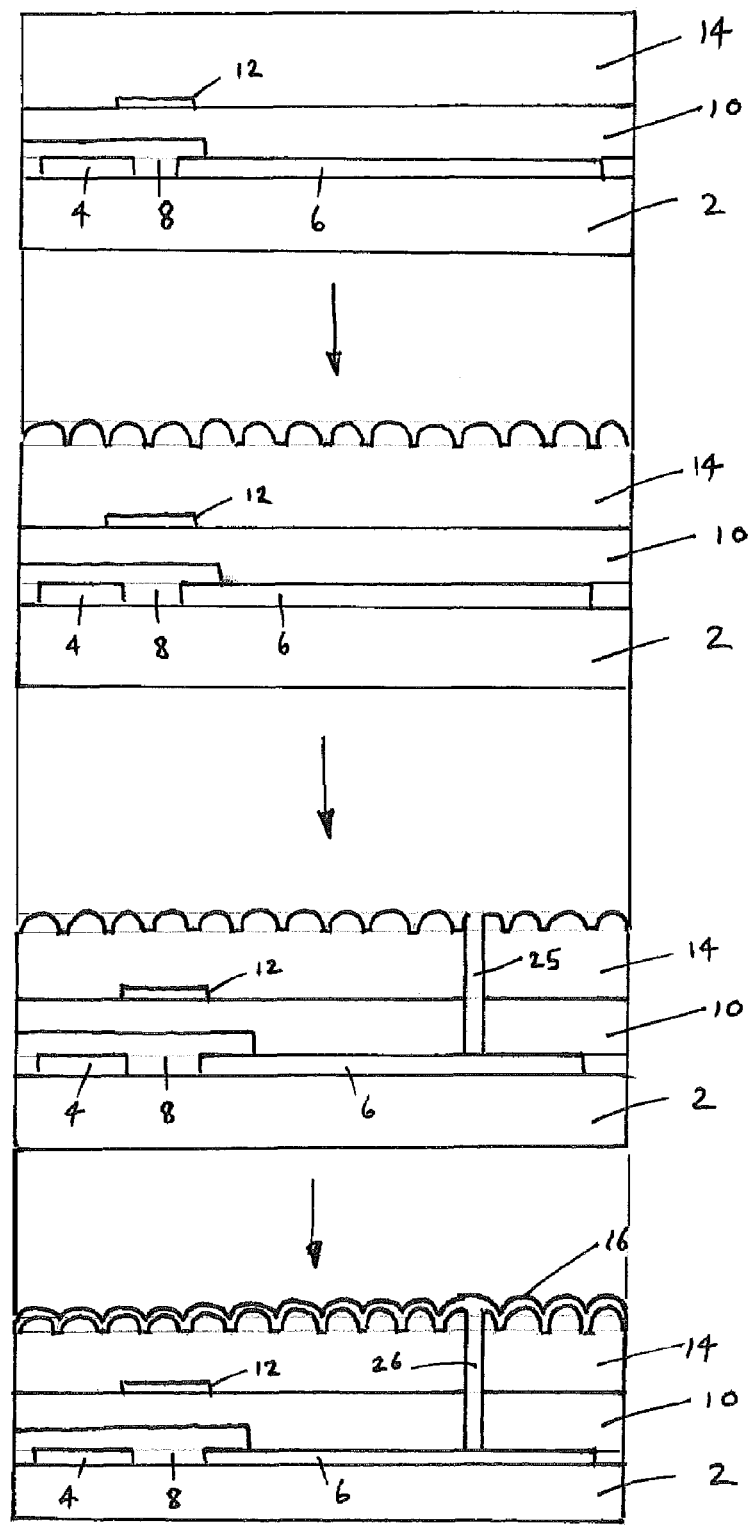
FIG. 2 illustrates an example of a technique for producing the control component illustrated in FIG. 1.

With reference to FIGS. 1 and 2, a control component according to an embodiment of the present invention comprises: a substrate 2; a first patterned conductive layer defining source electrodes 4 and drain electrodes for each of a planar array of TFTs as well as addressing lines (not shown) for addressing the source electrodes; a patterned layer of semiconductive material providing respective semiconductor channels 8 between each pair of source and drain electrodes; gate electrodes 12 capacitatively coupled to the semiconductor channels 8 via a gate dielectric region 10. An electrically insulating region 14 is provided over the whole of the above-mentioned resulting structure. For the reasons mentioned below, a laser ablatable material, such as an organic material having an absorption peak at the wavelength of an ultra-violet laser, is selected for at least the top part of this electrically insulating region 14.

Figure 3:
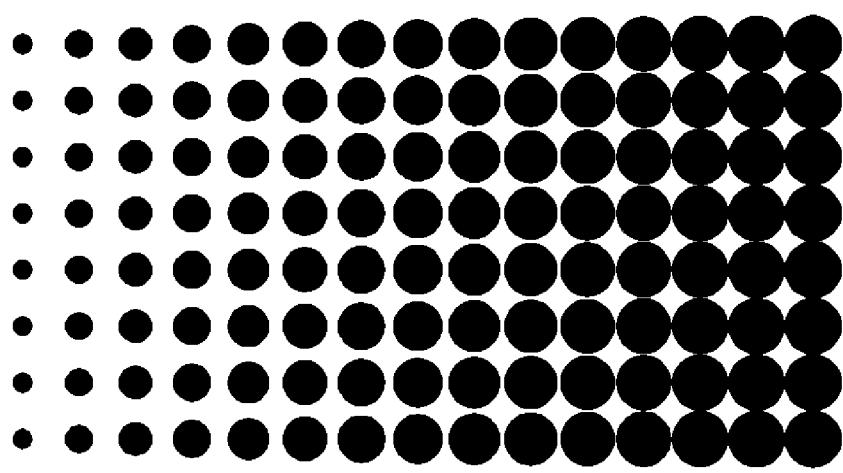
FIG. 3 illustrates an example of a laser mask for use in the process illustrated in FIG. 2.

Next, laser ablation is used to define in the top surface of the electrically insulating region an array of convex and/or concave features. Such three-dimensional features can, for example, be defined in the surface portion of the electrically insulating region by using multiple laser shots, each of which projects a slightly different ablation pattern onto the surface of the electrically insulating region 14. For the example of an array of convex features, a laser beam is focused on a unit area of the surface of the electrically insulating region in which a respective one of the convex features is to be defined, and successively increasing portions of the unit area are masked with each successive laser shot. An example of a laser mask 30 for use in such a technique is illustrated in FIG. 3. The black portions 32 represent the parts of the mask that do not transmit the laser light (dark-field parts). For any unit area of the surface of the insulating region 14, the first laser shot mask is carried out via one of the smallest dark-field circles and the mask is moved one dark-field circle to the left with each successive laser shot until the last laser shot is carried out via one of the largest dark-field circles.

With the mask illustrated in FIG. 3, a plurality of convex features are generated simultaneously in a unit area, and the laser ablation process is repeated for each unit area of the plurality of unit areas that make up the surface of the insulating region 14. The resulting surface topography comprises the 3-dimensional pattern defined by the mask repeated in an ordered way across the surface of the insulating region.

For example, the substantially convex structures have a radius substantially larger than the total ablation depth in some regions (i.e. at the lateral edge of the convex structures). It can be preferable that the surface topography is such that no point thereof has a tangent plane exhibiting an angle of greater than about 10 degrees with respect to the plane of the electrically insulating layer 14.

It is preferable that the array of convex or concave features exhibits a degree of irregularity in order to better avoid undesirable interference effects. A controlled degree of irregularity can be incorporated into the array of convex or concave features by designing the laser ablation mask of the kind illustrated in FIG. 3 accordingly. The resulting surface topography comprises the irregular 3-dimensional pattern defined by the mask repeated in an ordered way across the surface of the insulating region.

According to one example, an irregular 3-dimensional unit pattern having a footprint no smaller than that of a single pixel electrode 16 (discussed below) is repeated across the whole of the electrically insulating layer 14. According to a more specific example, the surface topography exhibits order between pixel electrodes 16, but not within any single pixel electrode 16.

The above-described array of convex features is just one example of an array of 3D features having a z-dimension (ablation depth) substantially less than its x-y dimensions.

For each drain electrode 6 of the array of TFTs, a respective via hole 25 is then defined in the insulating region 14 and gate dielectric region 10, which via holes 25 extend down to the respective drain electrode 6. These via-holes 25 are filled with conductive material to create interlayer conductive connects between the drain electrodes 6 and the respective pixel electrodes 16 formed in the next step. The pixel electrodes 16 are formed by depositing a layer of reflective material e.g. metallic material) by a conformal deposition technique whereby the surface of the deposited reflective layer has substantially the same topographic profile as that of the patterned surface of the insulating region 14, and then removing selected portions of the deposited layer of reflective material to define an array of pixel electrodes 16 each connected to a respective drain electrode 6 via a respective interlayer connect 26. One example of a conformal deposition technique is a vapour deposition technique such as sputtering. Examples of suitable materials for the reflective layer include metals and Poly(3,4-ethylenedioxythiophene).

Next, the display media 28 (such as liquid crystal display media) is arranged over the array of pixel electrodes. There may be one or more layers/components between the array of pixel electrodes 16 and the display media 28, such as an array of colour filters if the display device is a colour display device.

FIG. 1 also illustrates the reflection of light from one of the pixel electrodes 16 of the above-described example of a control component including an array of convex features defined in the pixel electrode. As shown in FIG. 1, the array of convex features defined in the pixel electrode 16 provides for specular reflection back through the display media at a range of different reflection angles relative to the plane of the pixel electrode 16 for incident light at any given angle relative to the plane of the pixel electrode 16. FIG. 1 shows a range of different reflection angles for one vertical plane, but there will of course be a similar range of reflection angles in each other vertical plane perpendicular to the plane of the pixel electrode 16. The total range of reflections for incident light at any given angle of incidence relative to the plane of the pixel electrode can be represented as a three-dimensional inverted cone having its tip at the pixel electrode 16 and having an axis parallel to the said direction of incident light.

This technique provides for good display brightness at a relatively large range of viewing angles even when the reflective display device is operated under light having a highly direction-dependent intensity.

The present invention is not limited to the foregoing examples. Aspects of the present invention include all novel and/or inventive aspects of the concepts described herein and all novel and/or inventive combinations of the features described herein.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

The invention claimed is:
1. A method of producing a control component for a reflective display device, the method comprising:
  forming over a substrate supporting an array of electronic switching devices an insulator region defining a surface having a controlled surface topography; and
  forming on said surface of the insulator region by a conformal deposition technique a substantially planar array of reflective pixel conductors,
  wherein each pixel conductor exhibits specular reflection at a range of reflection angles relative to the plane of the array of pixel conductors for a given incident angle relative to the plane of the array of pixel conductors,
  wherein the controlled surface topography comprises an array of curved convex features and/or an array of curved concave features;

wherein forming said insulator region having said controlled surface topography comprises depositing insulating material over said substrate and patterning by laser ablating a surface of the insulating material to achieve said controlled surface topography, and wherein said laser ablating comprises focusing a laser on a unit area of the surface of the insulating material via a succession of mask patterns, said mask patterns comprising dark field circles of different sizes; and wherein said reflective pixel conductors are each independently controllable via a respective one of said array of electronic switching devices.

2. A method according to claim 1, wherein the controlled surface topography is such that no point on said controlled surface topography has a tangent plane exhibiting an angle of more than about 10 degrees relative to the plane of the array of pixel conductors.

3. A method according to claim 1, wherein the controlled surface topography exhibits a controlled degree of irregularity.

4. A method according to claim 1, wherein the controlled surface topography defines a pattern repeated in an ordered manner over said surface of the insulator region.

5. A method according to claim 4, wherein said repeating pattern exhibits a degree of irregularity.

6. A method according to claim 1, wherein the controlled surface topography defines an irregular unit pattern repeated at a pitch substantially no smaller than the dimensions of one of the array of pixel conductors.

7. A method according to claim 1, wherein the controlled surface topography defines an irregular unit pattern repeated at a pitch greater than the wavelength of visible light.

8. A method according to claim 1, comprising focusing multiple laser shots on said unit area of said surface of the insulating material via said succession of different mask patterns.

9. A method according to claim 1, wherein said mask patterns comprise respective portions of a single laser mask, and said patterning comprises changing the position of the laser mask relative to the unit area between laser shots.

10. A method according to claim 1, wherein depositing said insulating material over said substrate comprises depositing said insulating material over said array of electronic switching devices.

11. A method according to claim 1, wherein each of the curved convex and/or curved concave structures has a radius substantially larger than a total ablation depth.

12. A method according to claim 1, wherein said controlled surface topography comprises curved convex structures having a radius substantially larger than a depth of ablation at a lateral edge of the curved convex structures.

13. A method of producing a control component for a reflective display device, the method comprising:

forming over a substrate supporting an array of electronic switching devices an insulator region defining a surface having a controlled surface topography; and forming on said surface of the insulator region by a conformal deposition technique a substantially planar array of reflective pixel conductors, wherein each pixel conductor exhibits specular reflection at a range of reflection angles relative to the plane of the array of pixel conductors for a given incident angle relative to the plane of the array of pixel conductors, wherein the controlled surface topography comprises an array of curved convex features and/or an array of curved concave features;

wherein forming said insulator region having said controlled surface topography comprises depositing insulating material over said substrate and patterning by laser ablating a surface of the insulating material to achieve said controlled surface topography, wherein said laser ablating comprises focusing a laser on a unit area of the surface of the insulating material via a succession of mask patterns, wherein each of said mask patterns comprises dark-field parts, and wherein each mask pattern comprises a different amount of said dark-field parts to others of said mask patterns, and wherein said reflective pixel conductors are each independently controllable via a respective one of said array of electronic switching devices.

14. A method comprising:

depositing insulating material over a substrate supporting an array of electronic switching devices;

laser ablating a surface of the insulating material after deposition over the substrate to define in said surface a controlled surface topography comprising an array of curved convex features and/or an array of curved concave features, wherein said laser ablating comprises focusing a laser on a unit area of a surface of the insulating material via a succession of different mask patterns, wherein each of said mask patterns comprises a dark-field circle, and wherein each mask pattern comprises a different size of dark-field circle with respect to others of said mask patterns;

forming on said surface of the insulating material having said controlled surface topography a substantially planar array of reflective pixel conductors by a conformal deposition technique;

wherein each pixel conductor exhibits specular reflection at a range of reflection angles relative to the plane of the array of pixel conductors for a given incident angle relative to the plane of the array of pixel conductors, and wherein said reflective pixel conductors are each independently controllable via a respective one of said array of electronic switching devices.

15. The method according to claim 14, wherein the controlled surface topography is such that no point on said controlled surface topography has a tangent plane exhibiting an angle of more than about 10 degrees relative to the plane of the array of pixel conductors.

16. The method according to claim 14, wherein each of the curved convex and/or curved concave structures has a radius substantially larger than a total ablation depth.

17. The method according to claim 14, wherein said controlled surface topography comprises curved convex structures having a radius substantially larger than a depth of ablation at a lateral edge of the curved convex structures.

* * * * *